US008199343B2

(12) United States Patent
Wayman et al.

(10) Patent No.: US 8,199,343 B2
(45) Date of Patent: Jun. 12, 2012

(54) PARTIAL ELECTRICAL DISCHARGE SYSTEM AND METHOD

(75) Inventors: William H. Wayman, Ontario, NY (US); Richard A. Lux, Webster, NY (US)

(73) Assignee: Xerox Corporation, Norwalk, CT (US)

( * ) Notice: Subject to any disclaimer, the term of this patent is extended or adjusted under 35 U.S.C. 154(b) by 1596 days.

(21) Appl. No.: 11/557,404

(22) Filed: Nov. 7, 2006

(65) Prior Publication Data

US 2008/0106753 A1 May 8, 2008

(51) Int. Cl.

| | |
|---|---|
| ***G06F 3/12*** | (2006.01) |
| ***G06K 15/00*** | (2006.01) |
| ***G01R 31/08*** | (2006.01) |
| ***H01H 31/12*** | (2006.01) |
| ***C04B 35/45*** | (2006.01) |

(52) U.S. Cl. ...... 358/1.15; 358/1.14; 358/1.1; 358/1.16; 324/536; 324/551; 505/126

(58) Field of Classification Search ........................ None
See application file for complete search history.

(56) References Cited

U.S. PATENT DOCUMENTS

| | | | | |
|---|---|---|---|---|
| 3,943,502 | A | 3/1976 | Huffsmith | |
| 4,631,473 | A | 12/1986 | Honda | |
| 5,123,102 | A | 6/1992 | Puckette | |
| 5,220,355 | A * | 6/1993 | Miyawaki | 347/199 |
| 5,465,619 | A | 11/1995 | Sotack et al. | |
| 5,541,721 | A | 7/1996 | Scheuer et al. | |
| 5,691,869 | A | 11/1997 | Engel et al. | |
| 5,903,220 | A | 5/1999 | Jon et al. | |
| 6,374,075 | B1 | 4/2002 | Benedict et al. | |
| 6,667,691 | B2 | 12/2003 | Sapir | |
| 6,681,084 | B1 * | 1/2004 | Reijnders | 399/44 |
| 7,307,820 | B2 * | 12/2007 | Henson et al. | 361/42 |
| 2003/0169051 | A1 * | 9/2003 | Tallman et al. | 324/523 |
| 2006/0038574 | A1 * | 2/2006 | Wayman et al. | 324/536 |

FOREIGN PATENT DOCUMENTS

| | | |
|---|---|---|
| EP | 1 060 895 B1 | 3/2006 |
| EP | 1 630 565 A1 | 3/2006 |

OTHER PUBLICATIONS

European Search Report, EP 05 25 5061, Munich, Nov. 28, 2005, Lopez-Carrasco, A.

M. Hikita, T. Hoshino, N. Hayakawa, T. Ueda and H. Okubo, Discrimination of Partial Discharge Electromagnetic Signal in $SF_6$ Gas from External Noises Using Phase Gate Control Method, Conference Record of the 1996 IEEE International Symposium on Electrical Insulation, Montreal, Quebec, Canada, Jun. 16-19, 1996.

D. D. Deic and J. A. Kornfield, "Electrostatic Discharge Monitor", IBM Technical Disclosure Bulletin, vol. 23 No. 6, Nov. 1980.

Kou Taikou, Patent Abstracts of Japan, "Electromagnetic Noise Measuring Device by Near Magnetic Field Probe".

* cited by examiner

*Primary Examiner* — David K Moore
*Assistant Examiner* — Marcus T Riley
(74) *Attorney, Agent, or Firm* — Fay Sharpe LLP

(57) ABSTRACT

Methods and systems are presented for detecting partial electrical discharges in a printing machine and for determining the source of the discharge events by detecting radio frequency signals using an antenna located near high voltage components of the printing system and determining whether a partial electrical discharge has occurred based on the detected signals. One or more of the high voltage components are then selectively enabled alone or in groups to isolate the source of the partial electrical discharge to expedite identification of suspect components and facilitate repair and system maintenance.

16 Claims, 7 Drawing Sheets

PARTIAL ELECTRICAL DISCHARGE SYSTEM AND METHOD

BACKGROUND

Printing systems such as copiers, printers, facsimile devices or other systems having a print engine for creating visual images, graphics, texts, etc. on a page or other printable medium typically include various high voltage components or systems used in the printing process. Such high voltage systems may include, for example, one or more charging devices or stations having a high voltage corona system, as well as the associated high voltage power supplies, wiring, connectors, etc. Such high voltage systems, moreover, may be subject to arcing type failures in which the device insulation becomes degraded leading to a high current electrical arc or dielectric breakdown that will require cleaning or replacement of one or more printing system components. For business owners, arcing problems in copiers, printers, fax machines, or other printing systems can be particularly frustrating and costly since trouble-shooting or diagnosing arcing problems may be a very lengthy process due to the large number of high voltage carrying cables and connectors and the difficulty in accessing these components by service personnel. In this regard, identifying the source of arcing in a large printing system may take many hours or even days, during which time the machine is essentially off-line. Thus, there is a need for improved diagnostic techniques and apparatus by which the costs and difficulties associated with arcing problems in printing machines can be mitigated or avoided.

INCORPORATION BY REFERENCE

U.S. patent application Publication No. US2006/0038574A1 (U.S. Ser. No. 10/924,045, Filed Aug. 23, 2004), published on Feb. 23, 2006, by William H. Wayman et al., and entitled, "Method of Detecting an Arcing Event and a Printing Machine Arranged with the Same" is totally incorporated herein by reference in its entirety.

BRIEF DESCRIPTION

Methods and systems are presented herein for detecting partial electrical discharge (PED) occurrences or events in printing machines or systems by which the above mentioned problems with arcing faults can be mitigated by early identification of system components undergoing partial electrical discharge before the components degrade to the point where arcing becomes a problem. By this technique, the high voltage systems of a printing system can be replaced or repaired early, for instance as part of regularly scheduled machine maintenance, without the significant repair costs and downtime associated with waiting for the onset of arcing. In certain exemplary printing machines, partial electrical discharge detection systems are provided that may notify the operator or service personnel in the event of partial electrical discharge, and may provide for semi- or fully-automated identification of the source of partial electrical discharge within the printing system so as to expedite servicing and procurement of replacement components. In this respect, the early detection and repair can facilitate reduction in unscheduled service calls, software crashes, communication interference, and improved machine availability and reliability.

Printing systems are provided which comprise high voltage systems and a partial electrical discharge detection system. In one example, the partial electrical discharge system comprises one or more antennas located proximate the high voltage systems in the printing system to receive radio frequency signals therefrom, as well as a signal detection system coupled with the antenna to receive the signals and a signal processing system that detects partial electrical discharge events based on the radio frequency signals. The detection system may further include a source isolation system which operates to selectively activate or deactivate individual high voltage systems or groups thereof and a processing system to correlate detected partial electrical discharge occurrences with activated high voltage systems or groups to identify one or more of the high voltage systems as a source of partial electrical discharges in the printing system. The detection system may provide indications to users, service personnel, or others to identify discharge events and/or the diagnosed sources thereof via a user interface of the printing machine and/or via a network coupled to the machine, and the diagnostic detection system may be operated locally or remotely through the network.

Other embodiments include a system for detecting partial electrical discharge in a printing system, which includes at least one antenna positioned near one or more printing system components and a signal processing system operatively coupled with the antenna that detects partial electrical discharge occurrences in the printing system components based on signals received by the antenna.

Further implementations of the disclosure include printing system diagnostic methods for detecting partial electrical discharge occurrences and identifying the source of partial electrical discharge occurrences in a printing system. The methods comprise detecting signals using an antenna that is located proximate a plurality of components in the printing system and processing the detected signals to determine whether a partial electrical discharge has occurred. The methods further provide for selectively activating individual printing system components or groups thereof and detecting partial electrical discharge occurrences in the activated printing system components to automatically identify one or more of the printing system components as being a source of partial electrical discharges in the printing system.

BRIEF DESCRIPTION OF THE DRAWINGS

The present subject matter may take form in various components and arrangements of components, and in various steps and arrangements of steps. The drawings are only for purposes of illustrating preferred embodiments and are not to be construed as limiting the subject matter.

DETAILED DESCRIPTION

Figure 1:
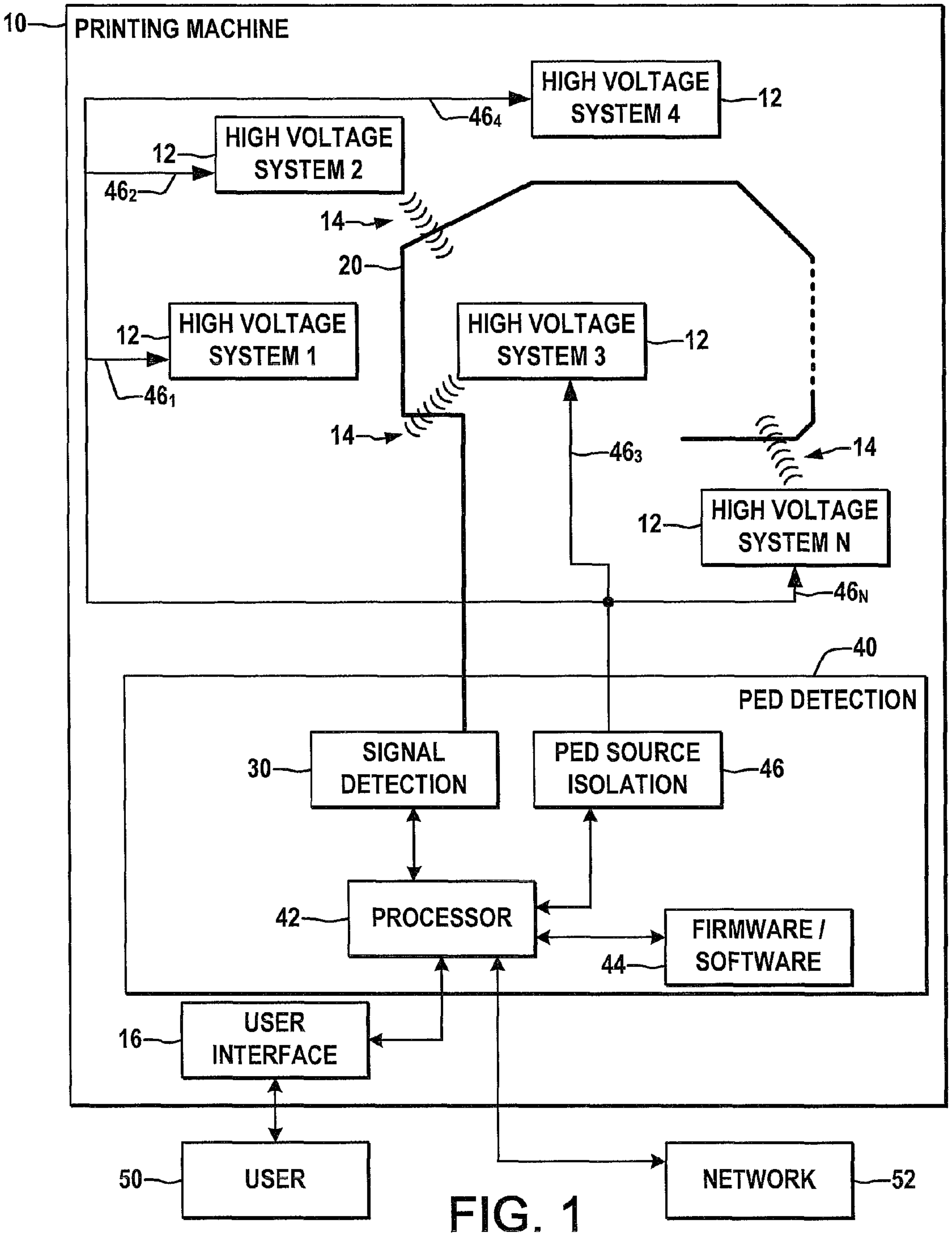
FIG. 1 is a schematic system level diagram illustrating a printing machine or system having an exemplary partial electrical discharge detection system.
Figure 2:
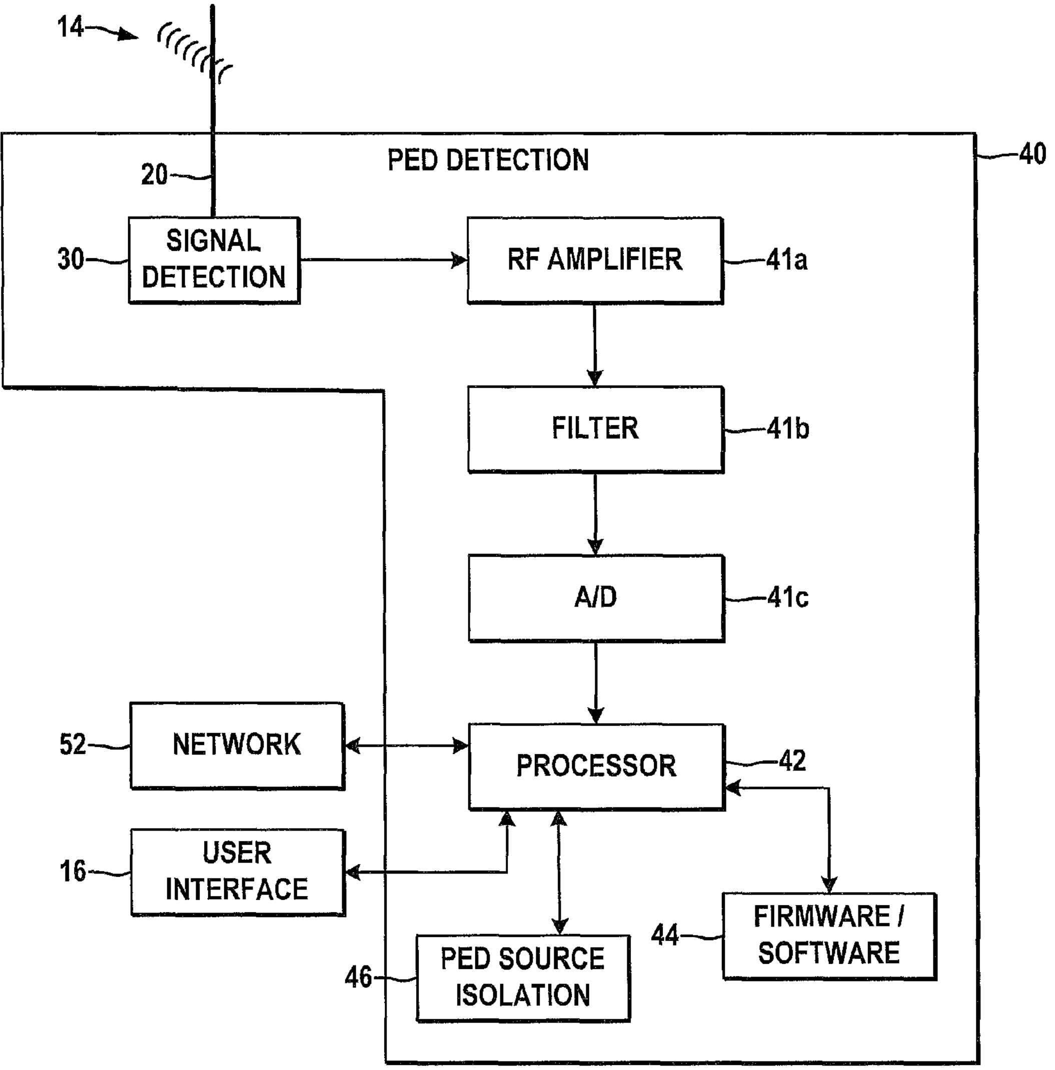
FIG. 2 is a schematic diagram illustrating further details of the partial electrical discharge system of FIG. 1.

Referring now to the drawings, FIGS. 1 and 2 depict a printing machine or system 10 with a plurality of high voltage systems or components 12 and a partial electrical discharge detection system 40 that includes an antenna 20 near or proximate to the high voltage components 12, as well as one or more components 30, 41, 42, 44 constituting a signal processing system to detect partial electrical discharge occurrences in the printing system 10 based on electromagnetic (e.g., RF) signals 14 received via the antenna 20. In this exemplary system 10, the high voltage systems 12 may be any form of electrical or electromechanical device or group of devices that uses or generates electrical power at voltages above about 30 volts, whether AC or DC, and which may be subject to partial electrical discharge events. Examples of high voltage printing system components 12 include without limitation corona devices, high voltage connectors, high voltage wiring, brush connections to cleaner brushes, brush connections to developer rolls, toner waste systems such as ducts, manifolds, waste bottles, cyclone separators, etc, paper path components, developer systems such as development system components, power supplies, corona systems for charging devices or stations, etc.

The printing system 10 can be any form of copier, printer, facsimile machine, or other system having one or more print engines or components by which visual images, graphics, text, etc. are printed on a page or other printable medium, including xerographic, electro photographic, and other types of printing technology, wherein such components are not specifically illustrated to avoid obscuring the various partial electrical discharge detection and source identification features of the system 40 of the present disclosure. The detection system 40 thus finds particular utility in the printing arts and more particularly in electro photographic or xerographic printing systems 10, in which a photoconductive surface is charged to a substantially uniform potential and is then exposed to record an electrostatic latent image corresponding to an original document or image to be reproduced. Subsequently, a developer material is provided to the latent image in a development zone and toner particles are attracted from the developer onto the latent image. The toner image is then transferred to a copy sheet or other printable medium and affixed thereto, wherein this exemplary printing process involves any number of high voltage systems 12 as shown in FIG. 1.

The exemplary partial electrical discharge detection system 40 provides for early detection of potential insulation and other component degradation manifested as partial electrical discharge by sensing radio frequency or other electromagnetic signals 14 using the antenna 20 and a radio frequency detector 30 to detect the onset of partial electrical discharge events occurring in one or more of the high voltage systems 12, wherein the amplitude and/or frequency content of the detected signals 14 can be used to differentiate between discharge events and other noise in the system 10, as well as to decide between different actions to be taken or inferences to be drawn with respect to partial electrical discharge. For instance, the system 40 may operate at a low detected signal level to take no action or to merely log a time stamped indication of a discharge event for subsequent access by service personnel at the next machine maintenance call, whereas the system 40 may cause or recommend a service call or even shut the system 10 down to avoid or mitigate damaging arcing failure and a call for service message for higher detected signal levels at certain indicative RF frequencies.

Moreover, the illustrated system 40 is operative to perform semi- or fully-automatic diagnostics to identify likely or suspected sources of partial electrical discharge in the system 10 using a discharge source isolation system 46 controlled by a processing component 42 and associated firmware or software 44. In one example, a software routine 44 can be operated by a user or service person 50 either locally via a user interface 16 or remotely via a network 52 coupled to the printing machine 10 to selectively activate or deactivate single high voltage components 12 or groups thereof while sensing signals on the antenna 20 that are indicative of partial electrical discharge to expeditiously isolate the problem to a specific system 12 or systems 12, thereby reducing service time. Moreover, the discharge event sensing or detection and the discharge source identification diagnostic functions may be performed in automated fashion without requiring significant user intervention, such as periodically for instance, in order to identify potential problems before the systems 12 degrade to the point of failure. In one implementation, the diagnostic routines may be executed after detection of a partial electrical discharge event, with the suspected high voltage system component or components 12 being identified automatically and a service call being scheduled via the network 52 or recommended via the user interface 16 such that service personnel can be informed of the event and suspected components 12 prior to making a service visit to attend to the machine 10. In this manner, partial electrical discharge can be advantageously detected and repaired before the onset of damaging arcing failure resulting in machine malfunction in a cost effective and expeditious manner to reduce or avoid machine down time. The detection system 40, moreover, may be constructed as a single device or a combination of two or more devices or apparatus, and may be implemented as any suitable hardware, software, firmware, logic, or combinations thereof, and may be distributed across multiple systems or devices.

Without wishing to be tied to any particular theory, it is believed that electromagnetic signals 14 of about 30 MHz or higher and about 300 MHz or lower are indicative of partial electrical discharge events, wherein the antenna 20, the signal detection system 30 and any subsequent hardware or software filtering and signal conditioning can be tuned or otherwise adapted for this or other frequency range of interest so as to be able to detect and identify likely partial discharge events in the system 10 and the high voltage components 12 thereof. A partial electrical discharge is, moreover, believed to represent a localized dielectric breakdown of a small portion of a solid or liquid electrical insulation system caused by high voltage stress on the insulation material, and is distinguished from actual arcing conditions or corona discharges which are manifested as a glowing involved in electrical conduction through air, wherein partial electrical discharges within an insulation system typically do not cause visible indications and tend to be more sporadic in nature than corona discharges. In addition, it is believed that partial electrical discharge events are commonly the result of voids or cracks in a solid dielectric, such as insulation over current carrying wires or connectors or power supply components, where such cracks appear at the interface between the conductive wire and the dielectric insulation or at a boundary between different insulating materials, and wherein the partial electrical discharge is typically limited to a portion of the insulation. Furthermore, these types of discharge events are believed to cause progressive degradation of the insulating material, and if not remedied, may lead to electrical breakdown and arcing conditions.

The partial electrical discharge detection system 40 of the present disclosure can be adjusted to discriminate between background levels normally associated with the system 10 other signal levels and/or frequencies particular to partial electrical discharges, for instance, by calibration routines performed with known good components 12 during normal printing operation of the system 10 to establish/quantify a "noise floor" characteristic with suitable thresholds for amplitude and/or frequency above the floor being established empirically or otherwise for use in deciding whether or not to characterize a particular detected signal 14 as indicating a partial discharge event and if so, what action to take. In this regard, degraded components 12 may be employed in attempting to characterize or establish such thresholds for a given system 10 and a given antenna configuration. Furthermore, the detection system 40 may employ more than one antenna 20, and the antenna(s) can be either a dedicated antenna structure or may be structures that serve another purpose or function within a given printing system 20, such as communications or control busses, power cabling, etc. In this respect, any suitable conductive structure or structures may be employed as an antenna 20 of the partial electrical discharge system 40.

Electrical insulation materials are believed to slowly degrade when subjected to intermittent or continuous partial electrical discharges, wherein inattention to such discharges may lead to unexpected component failure in a printing system 10, such as insulation breakdown in connectors, wiring cables, etc., that can lead to short circuits and high currents. The inventors have appreciated that the current levels associated with partial electrical discharges are typically much smaller than the total high voltage system current, and thus are not reliably identifiable by simple current monitoring. In addition to indicating a propensity of subsequent shorting, partial electrical discharges also generate electrical noise that may couple into other electrical circuits in the printing system 10, leading to undesirable software crashes, communication interference, etc. In the context of printing systems 10, moreover, radiated radio frequency noise can result in communication faults, machine clock timing errors, etc., and can therefore cause process control patch read errors and associated color shifts or faults.

As shown in FIGS. 1 and 2, the exemplary partial electrical discharge detection system 40 includes one or more antennas 20 positioned within the system 10 proximate the high voltage systems 12 so as to receive radio frequency signals 14 generated by one or more of the systems 12, wherein the example of FIG. 1 shows one possible situation in which the system 10 includes an integer number "N" high voltage systems, with systems 2, 3, and N undergoing partial electrical discharge and generating corresponding radio frequency signals 14, an in which the systems 1 and 4 are not emitting such signals 14. The antenna 20 receives the signals 14 and is operatively coupled with the signal detection system 30 that receives the signals 14 from the antenna 20. As best shown in FIG. 2, the system 40 further includes a signal processing system constituted by the detector 30, an RF amplifier 41*a*, one or more filters 41*b*, an analog to digital converter 41*c*, and a processor 42 operating according to firmware/software 44. This signal processing apparatus may be implemented in hardware and/or software/firmware and is operatively coupled with the signal detection system 30 to detect partial electrical discharge occurrences in the high voltage systems 12 based on the radio frequency signals 14, such as by providing a band pass filter 41*b* to reject frequencies below about 30 MHz and above about 300 MHz, and to compare any passed signal amplitudes to one or more amplitude thresholds as discussed further below.

As shown in FIGS. 1 and 2, the system 10 further includes a partial electrical discharge source isolation system 46, which may be a separate system or may be integrated in the discharge detection system 40, and which is operatively coupled with the high voltage components 12 and with the processing system 42. The source isolation system 46 in the illustrated implementation is operated by the processor 42 to selectively activate or deactivate individual high voltage systems 12 or groups thereof, by which the processing system 42, 44 can effectively enable certain systems 12 and determine whether any partial electrical discharge events occur to thereby identify suspect systems 12 or groups thereof as sources of partial electrical discharge. In one implementation, the detection system 40 is operable via commands from the user interface 16 to selectively activate or deactivate individual high voltage systems 12 or groups thereof via the source isolation system 46 and to detect partial electrical discharge occurrences in the activated components 12 using the signal detection and signal processing components 20, 30, 41, 42, 44 to identify one or more of the high voltage systems 12 as being a source of partial electrical discharges in the printing system 10. Alternatively or in combination, the detection system 40 is operable by commands from the network 52 to perform the detection and/or source identification functions. Moreover, the exemplary system 40 of FIGS. 1 and 2 can be operated in an automatic mode to perform these functions. The system 40 can also provide one or more indications of detected partial electrical discharge occurrences and/or the sources thereof in the printing system 10, wherein such indications may include without limitation creating and storing time stamped log entries denoting time, amplitude, frequency, and/or source(s) of particular partial electrical discharge events, generating status indications or messages rendered on or otherwise accessible via the user interface 16, generating messages sent to other devices via the network 52, generating requests for service visits, generating orders for replacement components 12, etc.

Referring also to FIGS. 3-6B, in operation, the processor 42 implements one or more software/firmware routines 44 and operates according to inputs from the user interface 16 and/or the network 52 to implement the various functions set forth herein, including without limitation performance of fully or semi-automatic diagnostic services for detecting partial electrical discharge occurrences and identifying the source of partial electrical discharge occurrences in a printing system 10. These diagnostics include detecting signals 14 using the antenna 20 located proximate the printing system components 12, processing the detected signals 14 to determine whether a partial electrical discharge has occurred, and upon determining that a partial electrical discharge has occurred, selectively activating individual printing system components 12 or groups thereof and detecting partial electrical discharge occurrences in the activated components 12 to identify one or more of the components 12 as being a source of partial electrical discharges in the printing system 10, and taking other actions and providing corresponding indications.

Figure 3:
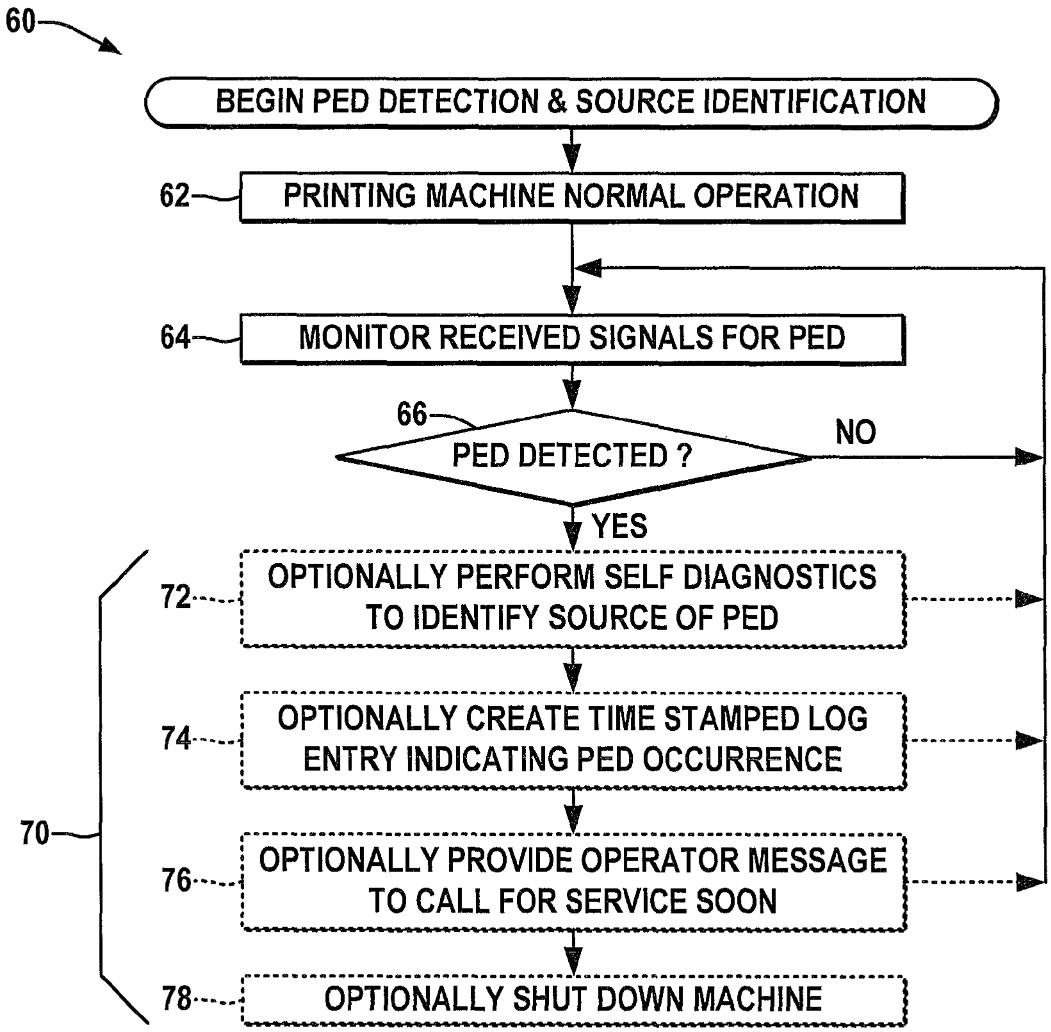
FIG. 3 is a flow diagram illustrating an exemplary method of detecting partial electrical discharge and identifying discharge source components in a printing system.

FIG. 3 illustrates an exemplary method 60 of detecting partial electrical discharge and identifying discharge source components in the printing system 20. While the exemplary methods are illustrated and described hereinafter in the form of a series of acts or events, it will be appreciated that the various methods in the claims below are not limited by the illustrated ordering of such acts or events except as specifically set forth therein. In this regard, except as specifically provided in the claims, some acts or events may occur in different order and/or concurrently with other acts or events apart from those acts and ordering illustrated and described herein, and not all illustrated steps may be required to implement a process or method in accordance with the present disclosure. The methods, moreover, may be implemented in hardware, software, or combinations thereof, in order to provide the described functionality, wherein these methods can be practiced in hardware and/or software of the above described systems or other hardware and/or software operatively associated with a printing system, wherein the disclosure is not limited to the specific applications and implementations illustrated and described herein.

The detection and source identification method 60 begins at 62 in FIG. 3, where the printing machine 10 is operated under normal conditions, and where the system 40 monitors received signals 14 at 64 using the antenna(s) 20, the signal detection system 30, and the signal processing system implemented in one example by the processor 42 and software/firmware 44, wherein the monitoring can be random, periodic, externally initiated, etc. A determination is made at 66 by the processing system 42 as to whether a partial electrical discharge event has occurred based on the processing and analysis of the received signal(s) 14, such as through frequency and/or amplitude analysis in certain implementations. If no partial electrical discharge is detected (NO at 66), the monitoring continues at 64 (e.g., periodically in one example). Once a partial electrical discharge is detected (YES at 66), the process 60 proceeds to perform one or more actions at 70. In one possible embodiment, the system 40 optionally performs automatic self diagnostics at 72 including without limitation selective activation of certain systems 12 alone and/or in groups to attempt to identify one or more of the systems 12 that are likely to be the source of the detected discharge. The system 40 may also optionally create one or more time stamped log entries at 74 that can be retrieved and viewed by users and/or service personnel 50 via the user interface 52 (FIG. 1) and/or via the network 52. Furthermore, the system 40 may provide an operator message at 76 (e.g., at the user interface 52) requesting that a service call be placed, and may thereafter return to monitor for further partial electrical discharge occurrences at 64. Moreover, the system 40 may shut down the printing machine 10 at 78.

Figure 4:
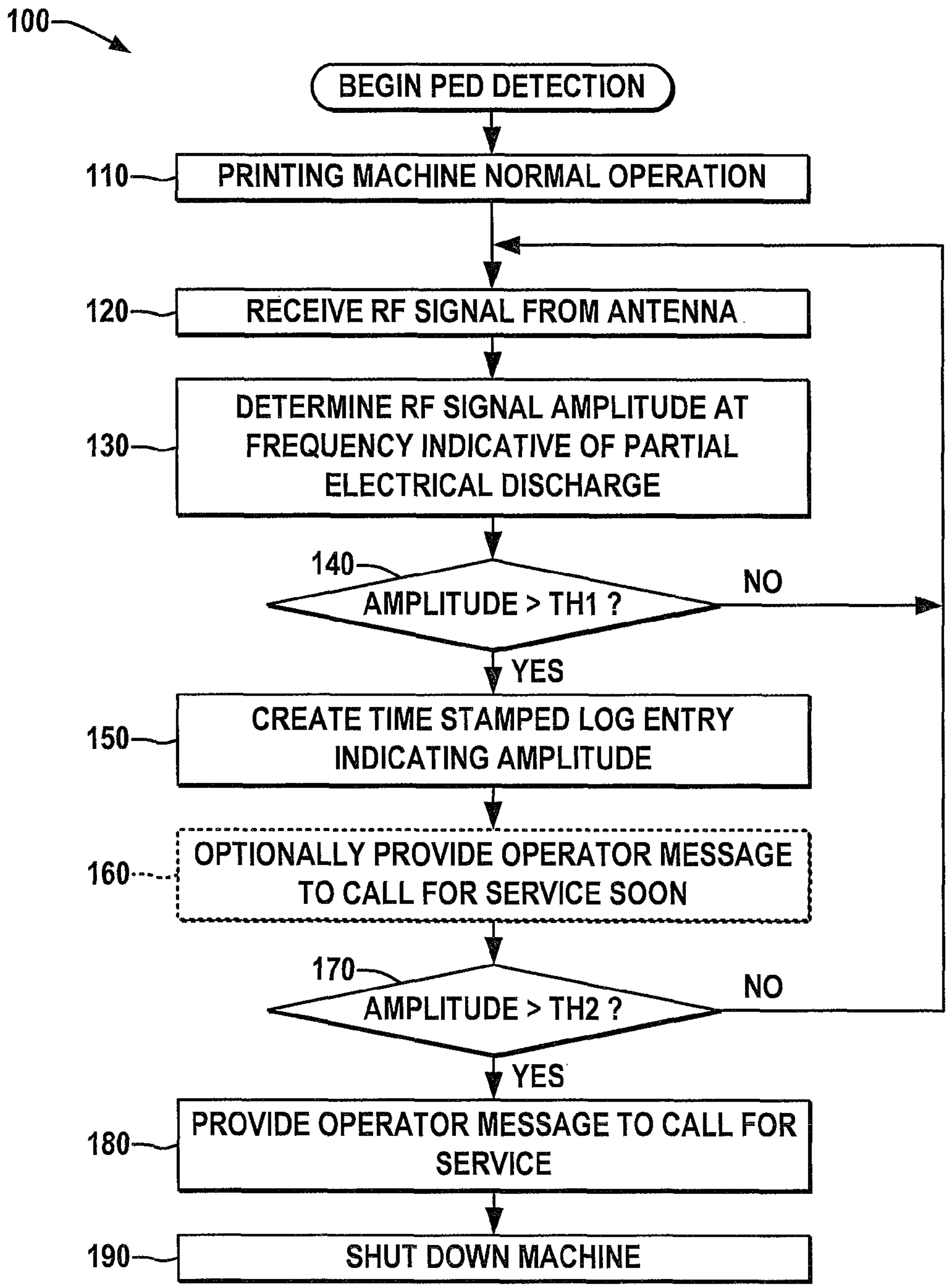
FIG. 4 is a flow diagram illustrating a detailed example of partial electrical discharge operation including selective performance of remedial actions based on received radio frequency signals in the printing system of FIG. 1.

FIG. 4 illustrates a flow diagram 100 showing a detailed example of partial electrical discharge operation including selective performance of certain exemplary remedial actions based on received radio frequency signals 14 in the printing system 10. At 110 in FIG. 4, the printing machine 10 is operated under normal conditions, and the system 40 receives an RF signal at 120 from the antenna(s) 20 using the signal detection system 30. At 130, the system 40 determines the RF signal amplitude at a frequency indicative of partial electrical discharge (e.g., about 30 MHz or more and about 300 MHz or less in one example). A determination is made at 140 as to whether the amplitude at the frequency of interest is above a first threshold TH1. If not (NO at 140), the process 100 returns to receive another signal at 120 as described above. If the detected signal amplitude is above TH1 (YES at 140), the system 40 creates and stores a time stamped log entry at 150 indicating the detected amplitude and may optionally provide an operator message (e.g. via the user interface 16 and/or network 52) to call for service soon. The amplitude is then compared with a second (higher) threshold TH2 at 170. If the amplitude is not above TH2 (NO at 170), the process 100 returns to 120 above, and otherwise (YES at 170), an operator message is generated to request a service call at 180, and the detection system 40 shuts down the printing machine 10 at 190.

Figure 5:
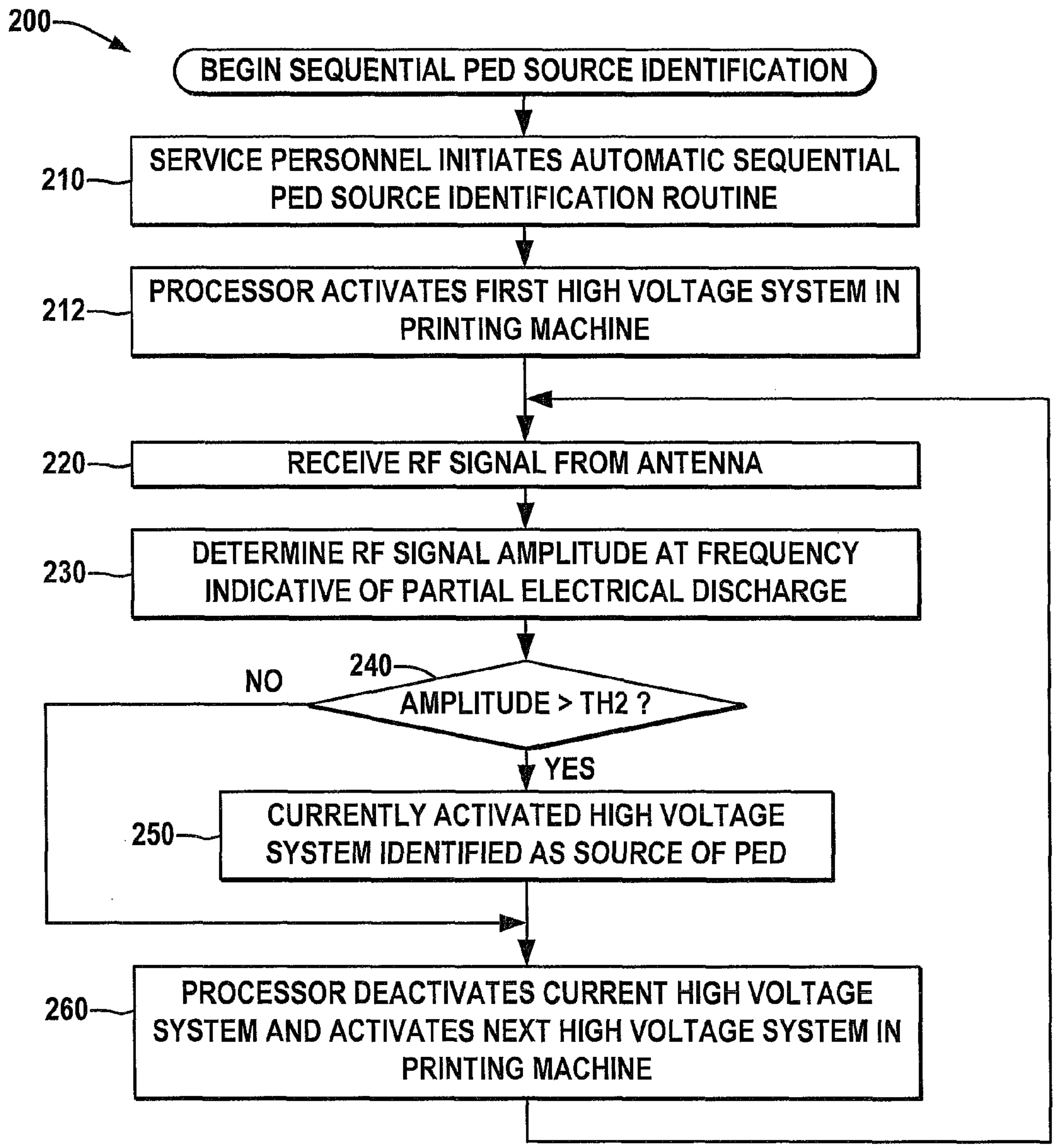
FIG. 5 is a flow diagram illustrating one exemplary technique for automatic identification or isolation of the source of partial electrical discharge in a printing system using sequential activation of individual high voltage system components.

FIG. 5 illustrates a method 200 for automatically identifying the source(s) of partial electrical discharge in the printing system 10, which may be initiated automatically by the system 40 itself (e.g., as part of the self diagnostics at 72 in FIG. 3) and/or which may be initiated by a user via the interface 16 or by service personnel locally via the interface 16 and/or remotely via the network 52. The example of FIG. 5 involves the system 40 sequentially activating single ones of the high voltage systems 12 (with the remaining components 12 being deactivated) using the source isolation system 46, and for each, determining whether a partial electrical discharge occurs. The sequential source identification begins at 210, wherein a service person initiates the automatic source identification routine at 210, and the processor 42 activates a first high voltage system 12 of the printing machine 10 at 212. The detection system 40 receives an RF signal 14 at 220 from the antenna 20 and determines at 230 the amplitude of the received signal 14 at a frequency or frequency range indicative of partial electrical discharge (e.g., about 30 MHz or more and about 300 MHz or less). A determination is made at 240 as to whether this amplitude is above the threshold TH2. If so (YES at 240), the system 40 identifies the currently activated system 12 as a source of the discharge. In either event, realizing the possibility of multiple components 12 suffering from such discharge, the process 200 continues at 260 with the system 40 deactivating the current system 12 and activating the next high voltage component 12, after which the process returns to 220 as described above. This process is then repeated for each of the high voltage systems 12 to sequentially isolate individual systems 12 and individually determine whether or net the current system 12 is emitting RF signals 14 indicative of partial electrical discharge by which the detection system 40 constructs a list of the suspected devices 12.

Figure 6A:
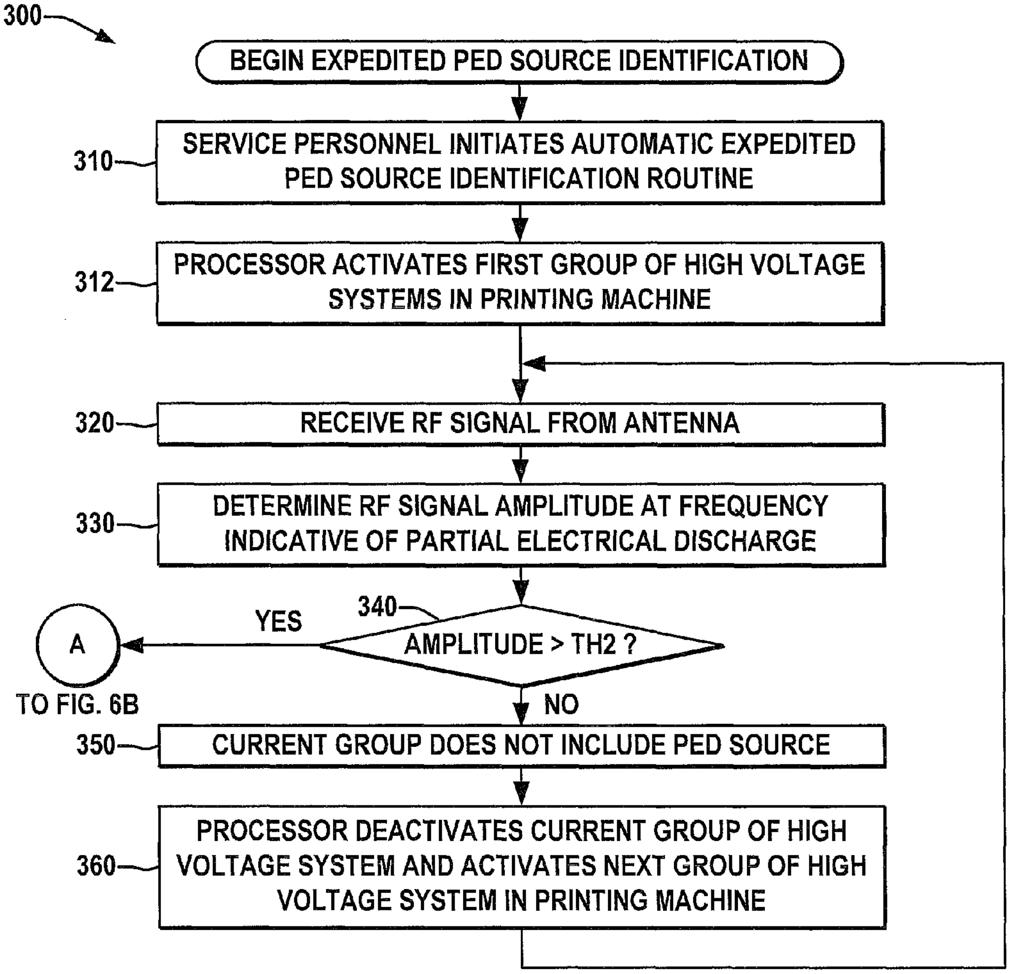
FIGS. 6A and 6B depict a flow diagram illustrating another possible technique for automatic identification of the source of printing machine partial electrical discharge by selective activation of groups of components to expedite printing system servicing.
Figure 6B:
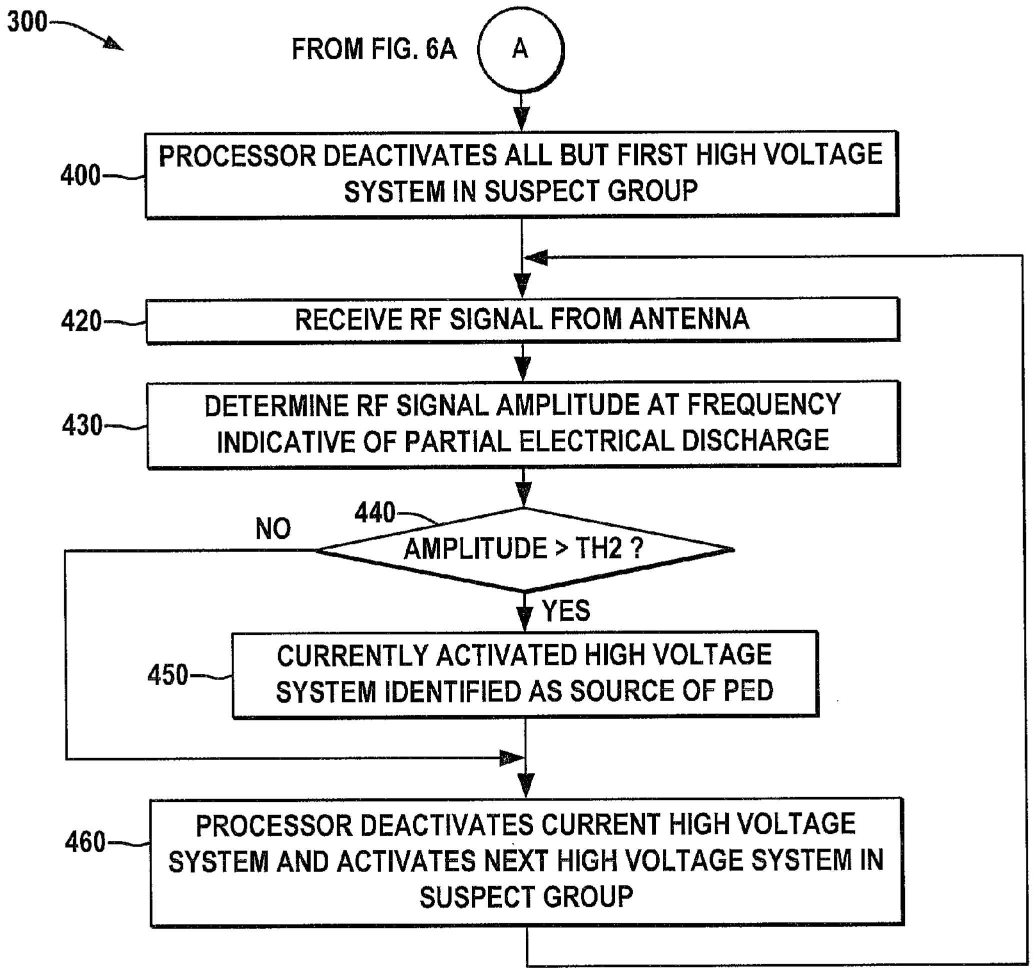

Referring now to FIGS. 6A and 6B, a flow diagram 300 illustrates another possible technique for automatic identification of the source partial electrical discharge in the printing system 10 by selective activation of groups of high voltage components 12 to expedite printing system servicing, which can be implemented using any suitable grouping algorithm and progressive elimination techniques, such as Newton's method, etc. to expeditiously identify the source(s) 12 of partial electrical discharge. In this regard, any or all the groups can include a single printing system component 12 or multiple components 12. The process 300 begins at 310 in FIG. 6A with a service person initiating the expedited source identification routine, whereupon the processor 42 activates a first group of the high voltage systems 12 at 312. An RF signal 14 is received by the system 40 at 320 from the antenna 20 and the amplitude of the received signal 14 at a suitable frequency or frequency range of interest is determined at 330. The system 40 then determines at 340 whether the signal amplitude is above the threshold TH2. If not (NO at 340), the system 40 assumes at 350 that none of the activated group of components 12 is the source of partial electrical discharge, and deactivates the current group at 360 and activates the next group, after which the process returns to test this newly activated group at 320. If, however, the amplitude of the first group exceeds TH2 (YES at 340), the process continues at 400 in FIG. 6B, where the system 40 subdivides the current group.

In the illustrated process 300, the suspected group is then analyzed individually, although other embodiments are possible wherein the suspect group is further divided into sub groups for further source identification processing. In the example of FIGS. 6A and 6B, the system 40 deactivates all but the first high voltage system 12 of the suspect group at 400, receives RF signals 14 at 420, determines the amplitude at the selected frequency (or range) at 430, and compares the amplitude at 440 with the threshold TH2 (or with another suitable threshold). If the amplitude is not above the threshold (NO at 440), the current system 12 is determined by the system 40 not to be a partial electrical discharge and is deactivated at 460, with the system 40 then activating the next system 12 of the suspect group. The process then returns to 420 to test this next component 12 of the suspect group. However, if the amplitude of the first tested high voltage component 12 exceeds the threshold (YES at 450), the system 40 identifies this component 12 as a discharge source at 450 and then proceeds to activate the next component 12 at 460 as described above. This process continues as shown in FIG. 6A to test and characterize all the members of the suspected group as either sources or non-sources of partial electrical discharge. The method 300 then activates the next group of untested high voltage systems 12 and returns to 320 in FIG. 6A, and the process 300 of FIGS. 6A and 6B continues until all the components 12 are either identified as partial electrical discharge sources or eliminated from suspicion.

The above examples are merely illustrative of several possible embodiments of the present disclosure, wherein equivalent alterations and/or modifications will occur to others skilled in the art upon reading and understanding this specification and the annexed drawings. In particular regard to the various functions performed by the above described components (assemblies, devices, systems, circuits, and the like), the terms (including a reference to a "means") used to describe such components are intended to correspond, unless otherwise indicated, to any component, such as hardware, software, or combinations thereof, which performs the specified function of the described component (i.e., that is functionally equivalent), even though not structurally equivalent to the disclosed structure which performs the function in the illustrated implementations of the invention. In addition, although a particular feature of the disclosure may have been disclosed with respect to only one of several embodiments, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising". It will be appreciated that various of the above-disclosed and other features and functions, or alternatives thereof, may be desirably combined into many other different systems or applications, and further that various presently unforeseen or unanticipated alternatives, modifications, variations or improvements therein may be subsequently made by those skilled in the art which are also intended to be encompassed by the following claims.

The invention claimed is:

1. A printing system, compromising:

a plurality of high voltage systems;

a partial electrical discharge detection system, comprising:

at least one antenna positioned within the printing system proximate the high voltage systems to receive radio frequency signals generated by the high voltage systems;

a signal detection system operation coupled with the antenna to receive the radio frequency signals from the antenna;

a signal processing system operatively coupled with the signal detection system and operative to detect partial electrical discharge occurrences in the high voltage systems based on the radio frequency signals;

a partial electrical discharge source isolation system operatively coupled with the plurality of high voltage systems and operative to selectively activate or deactivate individual high voltage systems or groups of the high voltage systems; and a processing system operatively coupled with the partial electrical discharge source isolation system and with the signal processing system, the processing system being operative to selectively activate or deactivate individual high voltage systems or groups of the high voltage systems using the high voltage source isolation system, to detect partial electrical discharge occurrences in the high voltage systems based on the radio frequency signals using the signal processing system, and to correlate detected partial electrical discharge occurrences with activated high voltage systems or groups thereof to identify one or more of the high voltage systems as being a source of partial electrical discharges in the printing system.

2. The printing system of claim 1, wherein the partial electrical discharge detection system is operable via a user interface of the printing system to selectively activate or deactivate individual high voltage systems or groups thereof and to detect partial electrical discharge occurrences in the activated high voltage systems to identify one or more of the high voltage systems as being a source of partial electrical discharges in the printing system.

3. The printing system of claim 1, wherein the partial electrical discharge detection system is operable in an automatic mode to selectively activate or deactivate individual high voltage systems or groups thereof and to detect partial electrical discharge occurrences in the activated high voltage systems to automatically identify one or more of the high voltage systems as being a source of partial electrical discharges in the printing system.

4. The printing system of claim 1, wherein the partial electrical discharge detection system is remotely operable via a network coupled with the printing system.

5. The printing system of claim 1, wherein the partial electrical discharge detection system provides an indication of detected partial electrical discharge occurrences in the printing system.

6. The printing system of claim 5, wherein the partial electrical discharge detection system provides an indication of one of more sources of detected partial electrical discharge occurrences in the printing system.

7. The printing system of claim 5, wherein the partial electrical discharge detection system provides the indication of detected partial electrical discharge occurrences via a user interface of the printing system.

8. The printing system of claim 5, wherein the partial electrical discharge detection system provides the indication of detected partial electrical discharge occurrences via a network coupled to the printing system.

9. The printing system of claim 1, wherein the printing system is a xerographic printing system and wherein the plurality of high voltage systems includes a high voltage corona system.

10. A system for detecting partial electrical in a printing system, comprising:

at least one antenna positioned proximate one or more components of the printing system to receive signals generating by the printing system components;

a signal processing system operatively coupled with the antenna and operative to detect partial electrical discharge occurrences in the printing system components based on the signals;

a partial electrical discharge source isolation system operatively coupled with the printing system components and operative to selectively active or deactivate individual printing system components or groups thereof; and a processing system operatively coupled with the partial electrical discharge source isolation system and with the signal processing system, the processing system being operative to selectively activate or deactivate individual printing system components or groups of the printing system components using the high voltage source isolation system, to detect partial electrical discharge occurrences in the printing system components based on the radio frequency signals using the signal processing system, and to correlate detected partial electrical discharge occurrences with activated printing system components or groups thereof to identify one or more of the printing system components as being a source of partial electrical discharges in the printing system.

11. The system of claim 10, wherein the processing system is operable in an automatic mode to selectively activate or deactivate individual printing system components or groups thereof and to detect partial electrical discharge occurrences in the activated printing system components to automatically identify one or more of the printing system components as being a source of partial electrical discharges in the printing system.

12. A printing system diagnostic method for detecting partial electrical discharge occurrences and identifying the source of partial electrical discharge occurrences in a printing system, the method comprising:

detecting radio frequency signals generated by a plurality of components in the printing system using an antenna located proximate the plurality of components in the printing system;

using a signal detection system in the printing system for receiving the radio frequency signals from the antenna;

using a signal processing system in the printing system for processing the detected signals to determine whether a partial electrical discharge has occurred; and upon determining that a partial electrical discharge has occurred; using a partial electrical discharge source isolation system in the printing system for selectively activating individual printing system components or groups thereof, using the signal detection system for detecting partial electrical discharge occurrences in the activated printing system components, and using a processing system in the printing system for correlating detected partial electrical discharge occurrences with activated printing system components or groups thereof to automatically identify one or more of the printing system components as being a source of partial electrical discharges in the printing system.

13. The method of claim 12, further comprising providing an indication of detected partial electrical discharge occurrences in the printing system.

14. The method of claim 12, further comprising providing an indication of one of more sources of detected partial electrical discharge occurrences in the printing system.

15. The method of claim 12, further comprising providing an indication of detected partial electrical discharge occurrences or one of more sources of detected partial electrical discharge occurrences in the printing system via a user interface of the printing system.

16. The method of claim 12, further comprising providing an indication of detected partial electrical discharge occurrences or one of more sources of detected partial electrical discharge occurrences in the printing system via a network coupled to the printing system.

* * * * *

UNITED STATES PATENT AND TRADEMARK OFFICE

CERTIFICATE OF CORRECTION

PATENT NO. : 8,199,343 B2
APPLICATION NO. : 11/557404
DATED : June 12, 2012
INVENTOR(S) : William H. Wayman and Richard A. Lux It is certified that error appears in the above-identified patent and that said Letters Patent is hereby corrected as shown below:

In the Claims

Column 9, line 58: "compromising" should be changed to --comprising--

Signed and Sealed this
Twenty-second Day of October, 2013

Teresa Stanek Rea
*Deputy Director of the United States Patent and Trademark Office*